US006136517A

United States Patent [19]

Fletcher

[11] Patent Number: 6,136,517

[45] Date of Patent: Oct. 24, 2000

[54] METHOD FOR PHOTO COMPOSITION OF LARGE AREA INTEGRATED CIRCUITS

[75] Inventor: Christopher L. Fletcher, Santa Barbara, Calif.

[73] Assignee: Raytheon Company, Lexington, Mass.

[21] Appl. No.: 09/036,090

[22] Filed: Mar. 6, 1998

[51] Int. Cl.[7] ........ G03F 7/20

[52] U.S. Cl. ........ 430/394; 430/312; 430/396

[58] Field of Search ........ 430/312, 394, 430/396

[56] References Cited

U.S. PATENT DOCUMENTS

| | | | |
|---|---|---|---|
| 4,343,877 | 8/1982 | Chiang | 430/5 |
| 4,397,543 | 8/1983 | Kolbe et al. | 355/40 |
| 4,600,309 | 7/1986 | Fay | 356/401 |
| 4,803,524 | 2/1989 | Ohno et al. | 355/53 |
| 4,849,313 | 7/1989 | Chapman et al. | 430/5 |
| 4,869,998 | 9/1989 | Eccles et al. | 430/311 |
| 5,100,508 | 3/1992 | Yoshida et al. | 156/659.1 |
| 5,132,195 | 7/1992 | Pool | 430/22 |
| 5,140,366 | 8/1992 | Shiozawa et al. | 355/53 |
| 5,144,363 | 9/1992 | Wittekoek et al. | 355/53 |
| 5,249,016 | 9/1993 | Tanaka | 355/53 |
| 5,308,741 | 5/1994 | Kemp | 430/312 |
| 5,364,718 | 11/1994 | Oae et al. | 430/5 |
| 5,411,823 | 5/1995 | Okamoto | 430/5 |
| 5,440,138 | 8/1995 | Nishi | 250/548 |
| 5,481,362 | 1/1996 | Van Den Brink et al. | 356/401 |
| 5,705,299 | 1/1998 | Tew | 430/5 |

OTHER PUBLICATIONS

"Modular CCDs: Building Blocks for large–area sensors" By Albert Theuwissen, Photonics Spectra, Jan. 1997.

*Primary Examiner*—Kathleen Duda
*Assistant Examiner*—Nicole Barreca
*Attorney, Agent, or Firm*—William C. Schubert; Glenn H. Lenzen, Jr.

[57] ABSTRACT

A method for forming very large scale integrated circuit devices employs a reticle having plural discrete image fields which may be respectively blocked off and exposed to form patterns on an integrated circuit wafer substrate. The division of the circuit pattern to be imaged into separate image fields is based on repeatable horizontal, vertical and two dimensional structures in the overall circuit pattern of the integrated circuit. By repeatedly exposing image fields corresponding to repeatable structures, the size of the integrated circuit device may be scaled without requiring similar scaling of the reticle itself. Efficient exposure of an entire wafer may be provided by having image fields including circuit patterns which include the scribe lanes which separate the integrated circuits on the wafer to be imaged.

17 Claims, 13 Drawing Sheets

FIG. 1
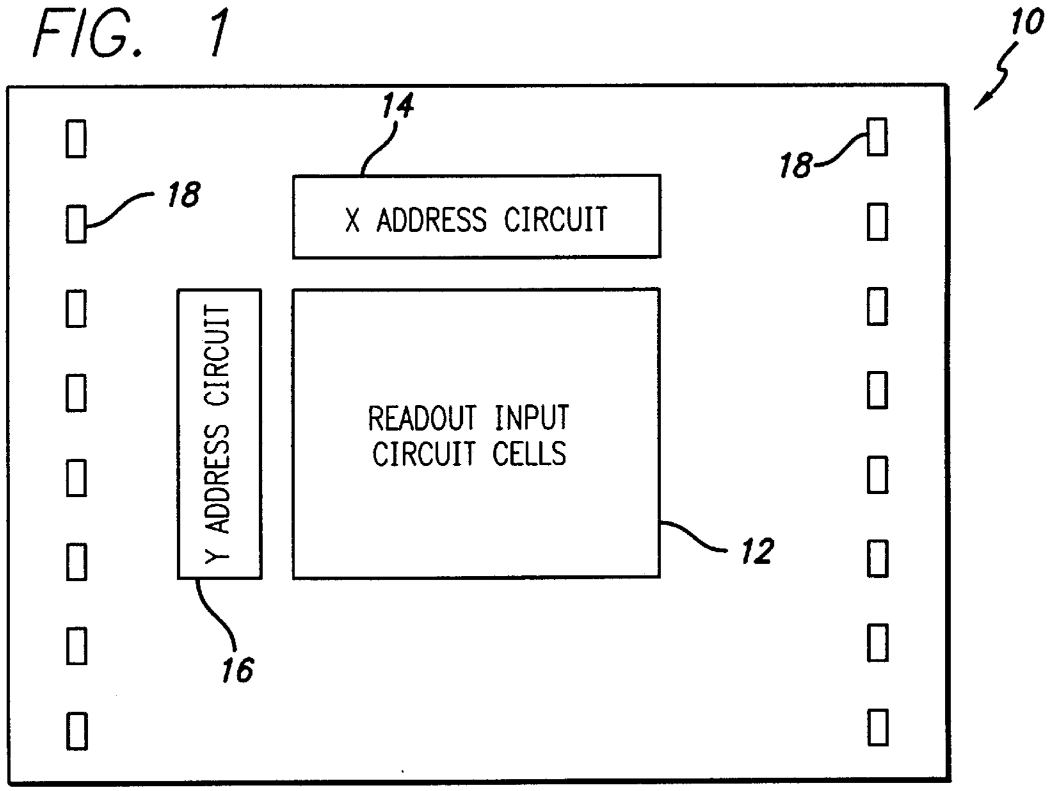
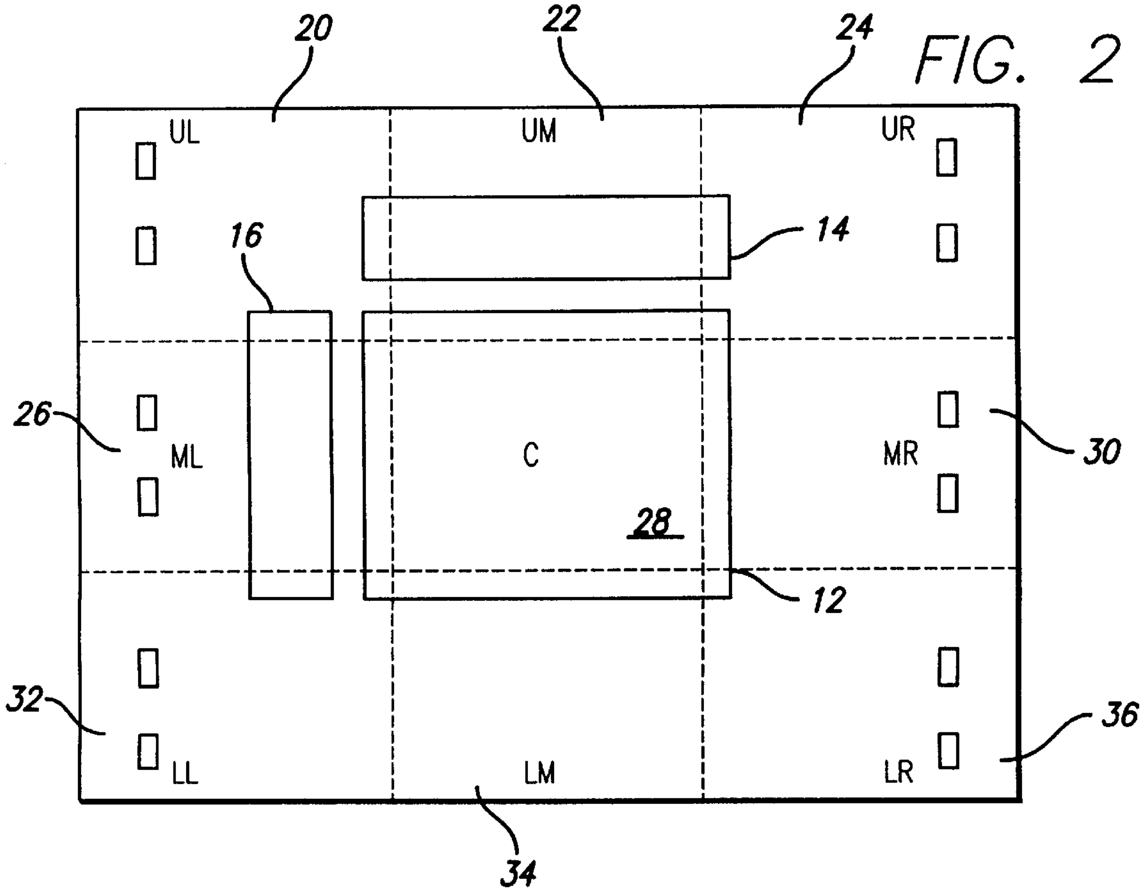
FIG. 2

METHOD FOR PHOTO COMPOSITION OF LARGE AREA INTEGRATED CIRCUITS

BACKGROUND OF THE INVENTION

1. Field of the Invention

The present invention relates to integrated circuit processing and in particular to photo lithography and patterning of semiconductor wafers. More specifically, the present invention is directed to processing of very large area integrated circuits such as infrared focal plane array readout circuits, charge coupled devices, and other imaging devices, random access memories, sequentially accessed memories, and other large area integrated circuit devices having repeating features in the integrated circuit pattern.

2. Description of the Prior Art and Related Information

During processing of semiconductor devices the semiconductor wafer must be exposed with the integrated circuit pattern for each integrated circuit on the wafer for each processing layer. Typically, the entire circuit pattern on the appropriate substrate for an integrated circuit device (or at least for a given layer of the device) is provided by repeatedly stepping and exposing a single image reticle or by a mask that has all copies of the circuit pattern which are transferred in a single exposure.

Reticle based exposure equipment, where the integrated circuit pattern is exposed repeatedly across the entire wafer, is suitable for integrated circuits requiring high density line and spacing features below approximately one micron and having dimensions of about 18 mm to 22 mm on a side or less. These size dimensions correspond to the maximum exposure image for currently available wafer stepper lens which typically have an image magnification reduction of 5 times. In many applications, integrated circuits larger than 18 to 22 mm on a side are highly desirable. For example, high resolution imaging devices with large numbers of pixels, e.g., 1024 by 1024 and greater, generally require such larger area integrated circuits.

For patterning larger area integrated circuits, i.e., those greater than 18–22 mm on a side, older technology 1× projection aligners that can pattern an entire semiconductor wafer with a single image are typically employed. However, the smallest feature size that can currently be patterned by such projection aligners is typically above 1.5 microns which limits the achievable circuit functionality. While such coarse pattern resolution is generally acceptable for certain large area integrated circuits, such as some charge coupled devices (CCDs) and low density infrared focal plane array readout integrated circuits (ROICs), such feature resolution is generally not adequate for many other applications. For example, memory chips, high resolution CCDS, focal plane array ROICs having small detector pitches (less than 25 microns) or focal plane array ROICs with large numbers of active devices for each input are generally not suitable for fabrication using 1× projection aligners.

Accordingly, a need presently exists for a method for patterning very large area integrated circuits with a pattern resolution or design rule feature much better than 1.5 microns.

SUMMARY OF THE INVENTION

The present invention provides a method for creating large area integrated circuit devices while retaining compatibility with submicron semiconductor processing technology.

In a first aspect the present invention provides a method for photo composition of an integrated circuit pattern on a semiconductor substrate employing a reticle pattern having a plurality of discrete image fields. Each image field corresponds to a portion of the integrated circuit pattern to be formed on the substrate. The photo composition method employs repeatedly exposing the semiconductor substrate with the image fields, each exposure creating a corresponding integrated circuit section. At least one of the image fields corresponds to a repeating circuit feature which may be scaled in size and such image field is exposed on the semiconductor substrate a plurality of times. The repeated exposing steps create a two dimensional contiguous array of exposed integrated circuit sections corresponding to the complete integrated circuit pattern. The repeated exposure of the image field of the repeating feature allows the corresponding circuit section to be increased in size, thereby increasing the size of the integrated circuit without the need to increase the size of the reticle. Such scaling of the circuit size thus allows the submicron processing technology available for conventional reticle imaging, without further capital or technological investment, to be maintained for large area integrated circuits.

For each exposure of an image field, each of the plurality of image fields other than the image field being exposed is optically blocked off. This step of optically blocking may preferably employ covering the image fields not being exposed by one or more aperture blocking vanes. Also, prior to each step of exposing, a positioning step is employed for positioning the reticle image field to be exposed relative to the center of the reticle image on the semiconductor substrate. The step of positioning may employ aligning the image field using a global alignment mark on the integrated circuit substrate.

In a further aspect the present invention provides a method of exposing a semiconductor wafer substrate with a pattern having a repeating feature so as to recreate the integrated circuit pattern four times on the wafer substrate corresponding to a number of discrete integrated circuit chips to be formed on the wafer substrate. The method employs a reticle pattern having a plurality of separate image fields including an image field corresponding to a portion of the repeating pattern of circuit features and a unique corner image field corresponding to the four corner sections of the integrated circuit layout pattern. The method employs repeatedly exposing the image field corresponding to a portion of the repeating circuit pattern to scale the size of the circuit pattern. The corner image field is repeatedly exposed on the wafer substrate such that corner portions of plural adjacent integrated circuits on the wafer substrate are simultaneously exposed with a single exposure of the corner image field eliminating the need to expose four individual corner images. The same is true for the horizontal and vertical size of the integrated circuit where two sides are combined across adjacent integrated circuit scribe lanes resulting in reduction of exposures from two to one. In this way an entire wafer may be exposed in an efficient manner while providing scalability of repeating circuit features to provide large area integrated circuits.

Further advantages of the present invention will be appreciated by consideration of a specific preferred embodiment of the present invention described below.

BRIEF DESCRIPTION OF THE DRAWINGS

FIG. 1 is an archetype block schematic drawing of an integrated circuit layout suited for processing in accordance with the method of the present invention.

FIG. 2 is a schematic drawing of the circuit of FIG. 1 partitioned into repeatable sections in accordance with the method of present invention.

DETAILED DESCRIPTION OF THE INVENTION

Figure 3:
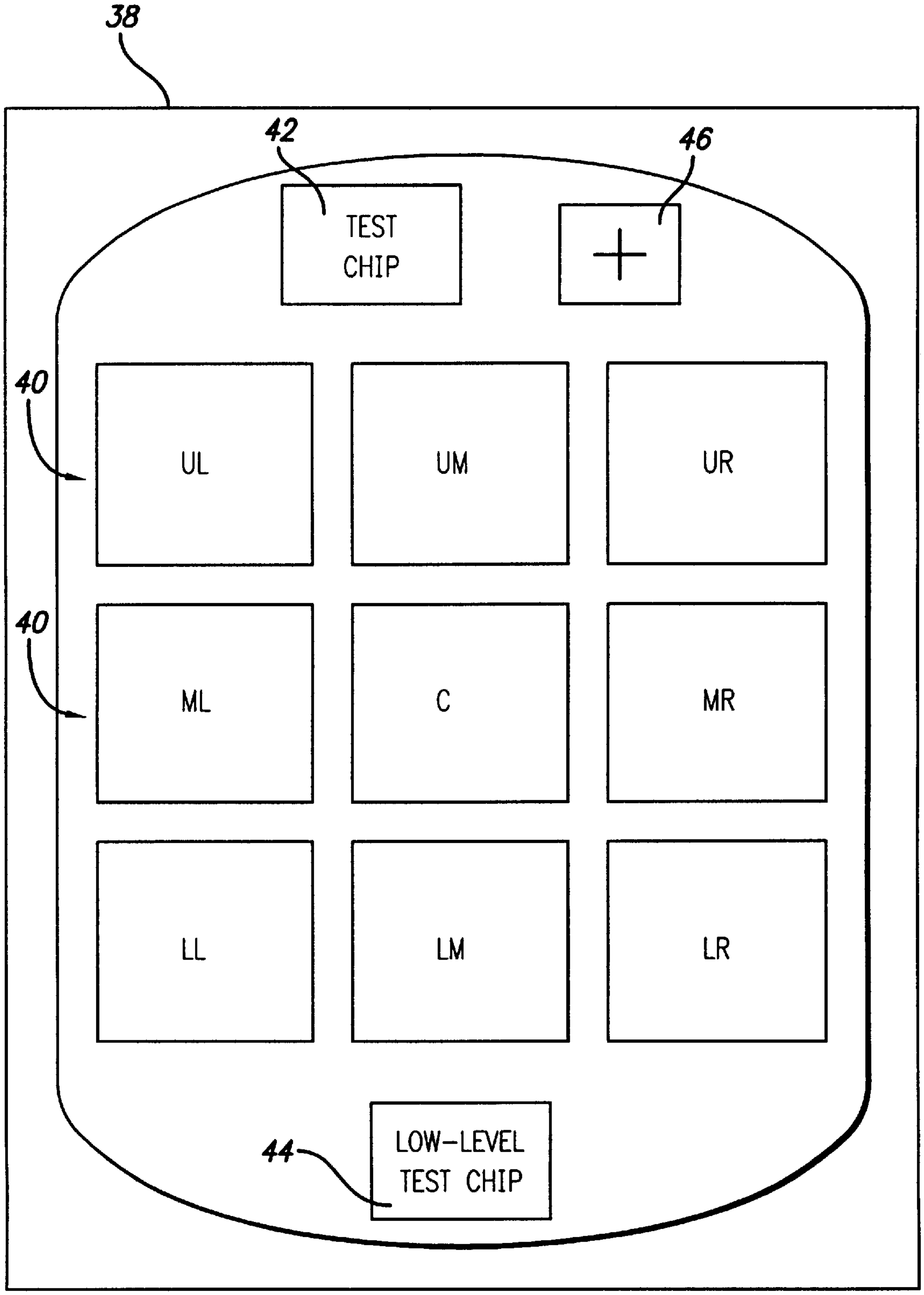
FIG. 3 is a schematic drawing of a reticle having a plurality of discrete image fields in accordance with the method of the present invention.

The present invention provides a method for forming circuit patterns for very large scale integrated circuits of the type having a repeated circuit feature forming a substantial portion of the integrated circuit pattern. One such integrated circuit layout for which the present invention may suitably be employed is illustrated in FIG. 1 in a block schematic drawing of a top view of an integrated circuit (IC) 10. The circuit layout of FIG. 1 generally corresponds to that of a readout IC (ROIC) for an imaging device and in particular for an infrared focal plane array. As will be discussed below in more detail, however, the method of the present invention is equally suitable for fabrication of many other integrated circuit devices and the layout of FIG. 1 is purely for illustration of the method of the present invention.

Referring to FIG. 1, the ROIC 10 is illustrated at a very general layout level with several groups of circuitry shown. Each circuitry group includes a large number of identical small scale circuit structures which repeat in one or two dimensions. This allows the circuit pattern to be scaled without changing the overall architecture. More particularly, the circuitry pattern illustrated in FIG. 1 includes a central circuitry block 12 which in the illustrated ROIC implementation includes a large number of readout cells equal in number to the desired array size of the imager. The individual readout cells are arranged in a two dimensional array, as illustrated generally by the rectangular shape of circuitry block 12, with the number of cells corresponding to the number of pixels to be imaged. The details of the circuitry within each readout cell depend on the specifics of the imaging technology and on the semiconductor processing technology employed, e.g., CMOS, CCD, CMOS with analog elements, etc. Irrespective of the detailed cell design, the readout cell block 12 has a repeatable structure in the form of identical circuitry for each cell which is repeated in a two dimensional pattern throughout the block 12. Accordingly, circuitry block 12 may be scaled in a two dimensional manner by merely repeating the cell patterns in block 12 to thereby increase the number of pixels and hence the focal plane size of the imager.

The ROIC 10 further includes X and Y address circuitry, 14, 16, respectively. The X and Y address circuitry allows individual cells in the readout cell block 12 to be addressed and readout with the outputs provided to the integrated circuit output pads 18. (The individual electrical traces connecting the output pads to the circuitry blocks and the individual blocks to each other are not shown in FIG. 1 for convenience of illustration). The address and output circuitry may also include suitable multiplexing, buffering, amplification, and other circuitry well known in the art for high speed readout of imaging ROICs in accordance with the requirements of specific applications and related design considerations.

It will be appreciated that both the X and Y address circuitry, 14, 16, as well as the integrated circuit output pads 18 are generally linear repeatable structures which may be scaled in size by repeating the linear pattern for each of these structures. That is, the X address circuitry may be scaled by repeating the pattern in the horizontal direction of FIG. 1, while the Y address circuitry may be scaled by repeating the pattern in the vertical direction. Although the X and Y address circuitry are shown in FIG. 1 as provided along the side and top of the readout cell block 12, it will be appreciated that various other architectures may equally be provided. For example, the address circuitry and associated multiplexer, buffer and other circuitry may be spaced on all sides of the readout cell block 12 or be arranged other than in the two sided manner as illustrated in FIG. 1. Nonetheless, the general linear repeatability and scalability of such structures is generally not affected by such design differences.

Referring to FIG. 2, the ROIC layout of FIG. 1 is illustrated partitioned into nine discrete circuit sections corresponding to the individually scalable or unique portions of the overall circuit pattern. As illustrated in FIG. 2, the integrated circuit is partitioned into an upper left (UL) circuit section 20, an upper middle (UM) circuit section 22, an upper right (UR) circuit section 24, a middle left (ML) circuit section 26, a center (C) circuit section 28, a middle right (MR) circuit section 30, a lower left (LL) circuit section 32, a lower middle (LM) circuit section 34 and a lower right (LR) circuit section 36. The nine way partitioning into sections illustrated in FIG. 2 is a very general partitioning of the layout of FIG. 1 into repeatable, and hence scalable, circuit sections of the integrated circuit pattern.

More specifically, the sections UL, UR, LL and LR (20, 24, 32 and 36, respectively) are unique sections in that they correspond to the corners of the integrated circuit and ends of the circuit patterns therein and hence must correspond to separate image sections. The circuit sections ML 26 and MR 30 in turn correspond to the most general vertically scalable circuit patterns in the IC layout. These sections must be separately provided since they also define respective outer edges of the IC. Sections UM and LM 22, 34, in turn correspond to the most general horizontally repeatable circuit sections which similarly must be separately provided to define the upper and lower edges of the IC. Finally, the central section 28 corresponds to the two dimensional repeatable portion of the integrated circuit.

Accordingly, FIG. 2 represents a very general partitioning of the overall layout of FIG. 1 in an arbitrarily scalable integrated circuit architecture. Although the nine way partitioning is the most general, it is not necessary that each section be the same size or the same shape, although equal size square sections are illustrated. For example, the corner sections UL, UR, LL, and LR may preferably be made smaller than the other sections if the architecture of the IC patterns permit.

Referring to FIG. 3, a top view of the layout of a reticle in accordance with the present invention is illustrated in a schematic drawing. As shown in FIG. 3, the reticle 38 is divided into a plurality of discrete image fields 40 corresponding to the discrete circuit sections of the integrated circuit pattern illustrated in FIG. 2. That is, each image field includes the mask pattern for the corresponding circuit section. The separate image fields are spaced apart as shown so that they may be separately exposed, as discussed below.

More specifically, referring to FIG. 3, the reticle is divided into nine discrete image fields labelled to correspond to circuit sections UL, UM, UR, ML, C, MR, LL, LM and LR as described above in relation to FIG. 2. The reticle layout of FIG. 3 also includes upper and lower test circuit patterns 42, 44, respectively, and a global alignment mark 46. The reticle 38 is adapted for use with a commercially available ASM 5X wafer stepper manufactured by ASM Lithography of Beldhoven, Netherlands. Such a wafer stepper and those from other exposure equipment manufactures having similar characteristics only require a single global alignment mark, alignment mark 46 illustrated in FIG. 3, to provide accurate positioning of a plurality of reticle images over portions of a wafer substrate. Description of the global alignment capability and operation of such a wafer stepper are described in U.S. Pat. No. 5,481,362, assigned to ASM Lithography, the disclosure of which is incorporated herein by reference.

The aforementioned commercially available ASM 5X stepper includes an XY vane optical aperture blocking system which allows arbitrary rectangular portions of the reticle to be blocked off while the exposed image portion of the overall reticle is used to pattern the wafer during a particular wafer processing step. This feature was provided in the stepper to allow the global positioning mark and test circuits to be separately exposed and located anywhere on the wafer substrate. However, in accordance with the present invention, this capability is exploited to allow the discrete image fields 40 to be sequentially blocked off during composition of the entire integrated circuit pattern by exposing the various reticle image fields corresponding to each circuit section of the entire integrated circuit pattern.

Although the reticle illustrated in FIG. 3 has a plurality of discrete image fields 40, as compared to conventional approaches where a single integrated circuit image is provided on the reticle, nonetheless conventional reticle fabrication procedures may be employed. Therefore, the reticle pattern of FIG. 3 does not require any greater tooling costs than for a conventional single image field reticle pattern.

Figure 4A:
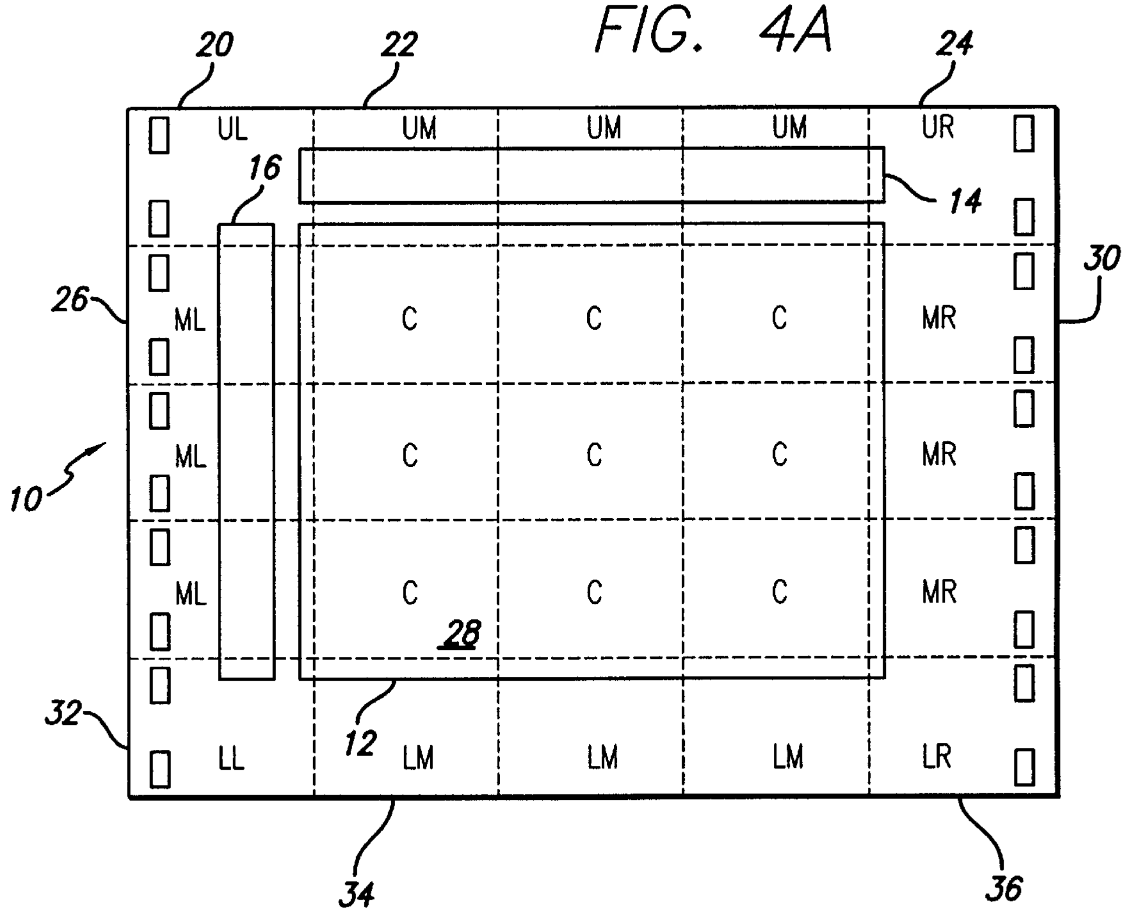
FIGS. 4A and 4B are schematic drawings of two different integrated circuit patterns formed by using the reticle of FIG. 3, in accordance with the method of the present invention.
Figure 4B:
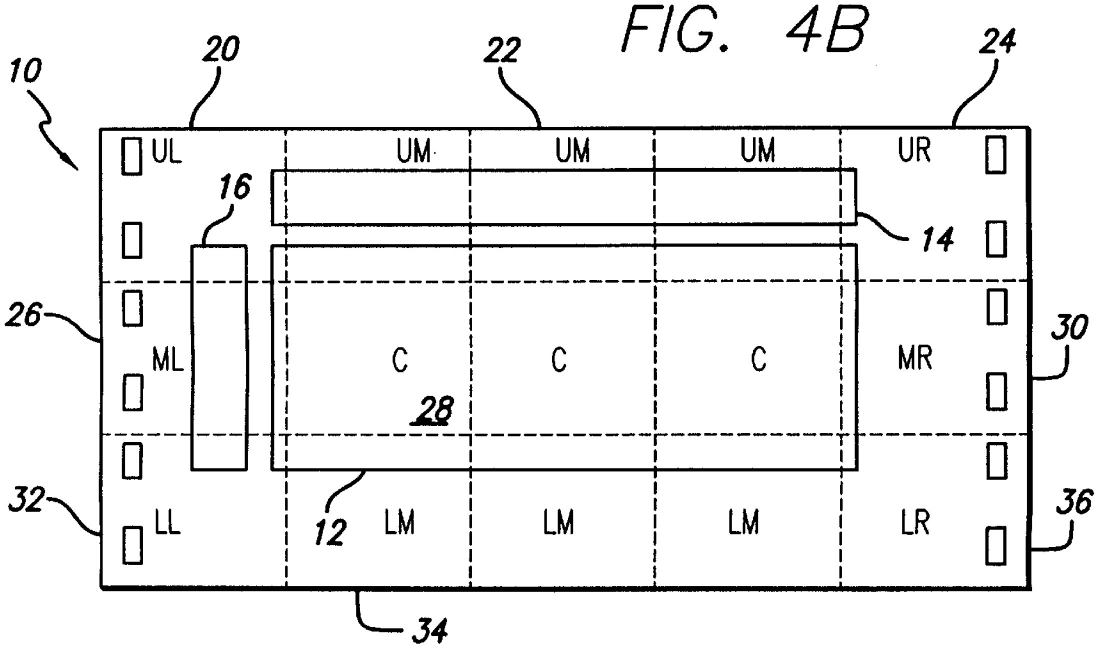

Referring to FIGS. 4A and 4B, it will next be explained how the reticle illustrated in FIG. 3 may be employed in accordance with the present invention to provide scalable integrated circuit patterns including integrated circuits having both differing geometries and increased overall size.

Referring to FIG. 4A, the illustrated integrated circuit pattern includes the nine discrete circuit sections illustrated in FIG. 2, imaged by the discrete reticle image fields 40 in FIG. 3. The horizontal, vertical and two dimensional repeatable patterns have been imaged a number of times to provide the desired dimensions of the overall integrated circuit 10.

More specifically, the integrated circuit pattern illustrated in FIG. 4A includes the four corner sections UL, UR, LL and LR (20, 24, 32 and 36, respectively) imaged a single time. The sections UM (22) and LM (34) have been imaged three times each extending the corresponding circuitry horizontally three times that illustrated in FIG. 2. The sections ML and MR (26, 30, respectively) have also been imaged three times, vertically extending the corresponding circuitry three times. The center section C 28, in turn, has been exposed nine times extending the area of the readout input circuit cell section by a corresponding factor of nine.

Accordingly, it will be appreciated that by consecutively exposing image fields corresponding to the repetitive portions of the circuit layout of FIG. 2, a considerably larger readout integrated circuit may be provided having the same architecture, as illustrated in FIG. 4A. This allows ROICs with increased array size up to the boundary of the substrate or wafer. Since each exposure of the image fields is provided in an otherwise conventional manner, however, semiconductor pattern resolutions currently available may be maintained even for very large devices. For example, submicron resolutions, e.g., 0.8 microns or less, may readily be provided for ICs having dimensions greater than 18–22 mm on a side.

FIG. 4B illustrates a different size and geometry from FIG. 4A created with the same image fields as FIG. 4A. Therefore, the circuit pattern of the integrated circuit sections is the same with only the size and geometry being changed.

More particularly, the layout of FIG. 4B includes, in addition to the four corner sections UL, UR, LL and LR, a three times repetition of the horizontal repeating sections UM and LM and a three times repetition of the two dimensional pattern C. This in turn provides a three times increase in the available readout array circuitry over the ROIC of FIG. 2 (the circuits of FIGS. 2, 4A and 4B are not drawn to scale and therefore do not directly reflect this size difference.)

Accordingly, it will be appreciated that the same reticle illustrated in FIG. 3 can be used to image any of the patterns illustrated in FIGS. 2, 4A and 4B as well as various horizontal, vertical or two dimensional extensions of the repeating patterns therein. Therefore, not only may large integrated circuits be readily formed while maintaining high precision and small device geometries but in addition flexibility to provide differing IC layout geometries is provided within a single reticle.

Although the specifics of the exposure of the IC substrate in accordance with the present invention will be apparent to those skilled in the art, the operation of the above noted ASM lithography system in accordance with the method of the present invention will be briefly described.

In operation, the global alignment mark 46 in the reticle image of FIG. 3 and the aperture vaning capabilities of the aforementioned ASM wafer stepper are used to position the wafer relative to the stepper and block all but the desired image field. Once the desired image field 40 is isolated by the optical blocking vanes from the other fields, it is repeatedly exposed on the wafer a number of times at desired positions corresponding to the chosen geometry and layout. In particular, nine separate image field blocking steps will be required, each followed by multiple image field exposures to expose the entire wafer.

To outline such a process, referring to FIGS. 3 and 4A, first the image field corresponding to the circuit section UL (20) will be isolated by the optical blocking vanes and exposed on the wafer substrate a plurality of times equal in number to the total number of ICs on the wafer. Next, the image field corresponding to circuit section UM is optically isolated by the vanes and exposed three times sequentially, as illustrated by the three consecutive regions 22 in FIG. 4A, for each IC on the wafer. Next, the image field for circuit section UR (24) is optically isolated by the blocking vanes and exposed a single time for each IC on the wafer. Next, the image field for circuit section ML is isolated by the blocking vanes and exposed three times in a vertical sequence, to provide the three consecutive regions 26 as illustrated in FIG. 4A, for each IC on the wafer circuit. Next, the reticle image field 40 corresponding to the circuit section C is optically isolated by the blocking vanes and exposed nine consecutive times in a two dimensional pattern to provide the nine regions 28 illustrated in FIG. 4A, for each IC on the wafer. Next, the image field corresponding to circuit section MR is optically isolated by the vanes and exposed three times vertically to provide the three regions 30 in FIG. 4A, for each IC on the wafer. Next, the image field for circuit section LL is isolated by vanes and exposed a single time to provide the single region 32 illustrated in FIG. 4A, for each IC on the wafer. Next, the image field for circuit section LM is optically isolated and exposed horizontally three consecutive times to provide regions 34, for each IC on the wafer. Finally, the image field for circuit section LR is optically isolated by the vanes and exposed a single time to provide region 36 illustrated in FIG. 4A, for each IC on the wafer.

It will be appreciated that the sequence in which the image fields are blocked off and exposed is not of any consequence to the ultimate application of the ROIC and may be provided in any order. Therefore, this sequence will be selected to minimize wafer stepping time and time associated with moving the aperture vanes, to thereby reduce associated time costs.

Figure 5:
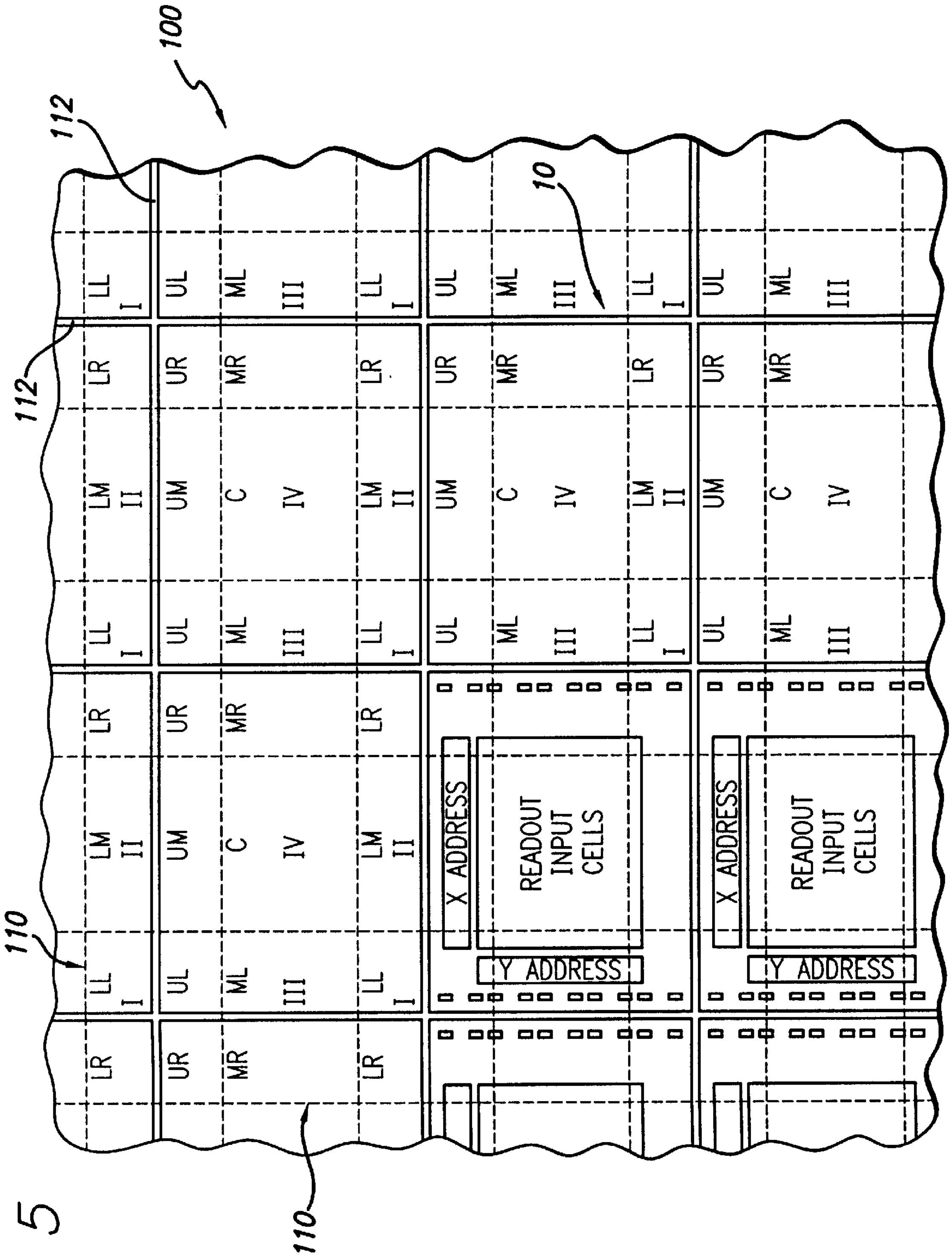
FIG. 5 is a schematic drawing of a portion of a wafer having a plurality integrated circuits patterned thereon and being partitioned in accordance with an alternate embodiment of the method of the present invention.

Referring to FIG. 5, a portion of a wafer 100 including a plurality of separate integrated circuits 10 is illustrated in accordance with an alternate embodiment of the present invention. In accordance with this embodiment of the present invention, the wafer 100 is divided into a plurality of separate wafer sections 110 (shown by dashed lines in FIG. 5) which correspond to discrete image fields on a reticle (described below in relation to FIGS. 6A and 6B). That is, the overall pattern on the wafer 100 is composed by piecing together the separately exposed wafer sections 110, which individual wafer sections can overlap plural adjacent ICs 10. This allows a more efficient use of the reticle imaging area while retaining the capability for scaling repeatable portions of an integrated circuit pattern as described above in relation to FIGS. 1–4.

More specifically, referring to FIG. 5, the individual ICs 10 are separated by X and Y dicing (or scribe) lanes 112. For ease of illustration and clarity, however, the general layout of the ICs 10 have not been shown in FIG. 5 but will have a repeatable circuit pattern therein. For example, each of the ICs 10 may correspond generally to the overall IC pattern described above in relation to FIGS. 1, 2, 4A and 4B and have horizontal and vertically repeatable patterns corresponding to the X and Y address circuitry and the two dimensional repeatable pattern corresponding to the readout cells as illustrated in FIG. 1. Also, the division within each IC 10 into circuit sections marked UL, UM, UR, ML, C, MR, LL, LM and LR corresponds to that shown in FIG. 2 and which may be scalable in the manner described above in relation to FIGS. 4A and 4B.

Inspection of FIG. 5 will show that the wafer sections 110 fall into four separate patterns illustrated in FIG. 5 by roman numerals I–IV, respectively. In particular, the first wafer section I includes the four corner sections of the IC pattern, i.e., circuit sections LR, LL, UR and UL. The second wafer section II includes the circuit sections UM, LM, respectively. Wafer section III in turn includes circuit sections MR and ML while wafer section IV includes circuit section C. It will thus be appreciated that the repeated imaging of the four discrete wafer sections 110 (I–IV) allows the entire pattern of the wafer 100 to be imaged as illustrated in FIG. 5. This in turn allows four image fields to be employed in the reticle as opposed to the nine fields described in the previous embodiment thereby providing a more efficient use of the reticle imaging area for exposure of the entire wafer.

Figure 6A:
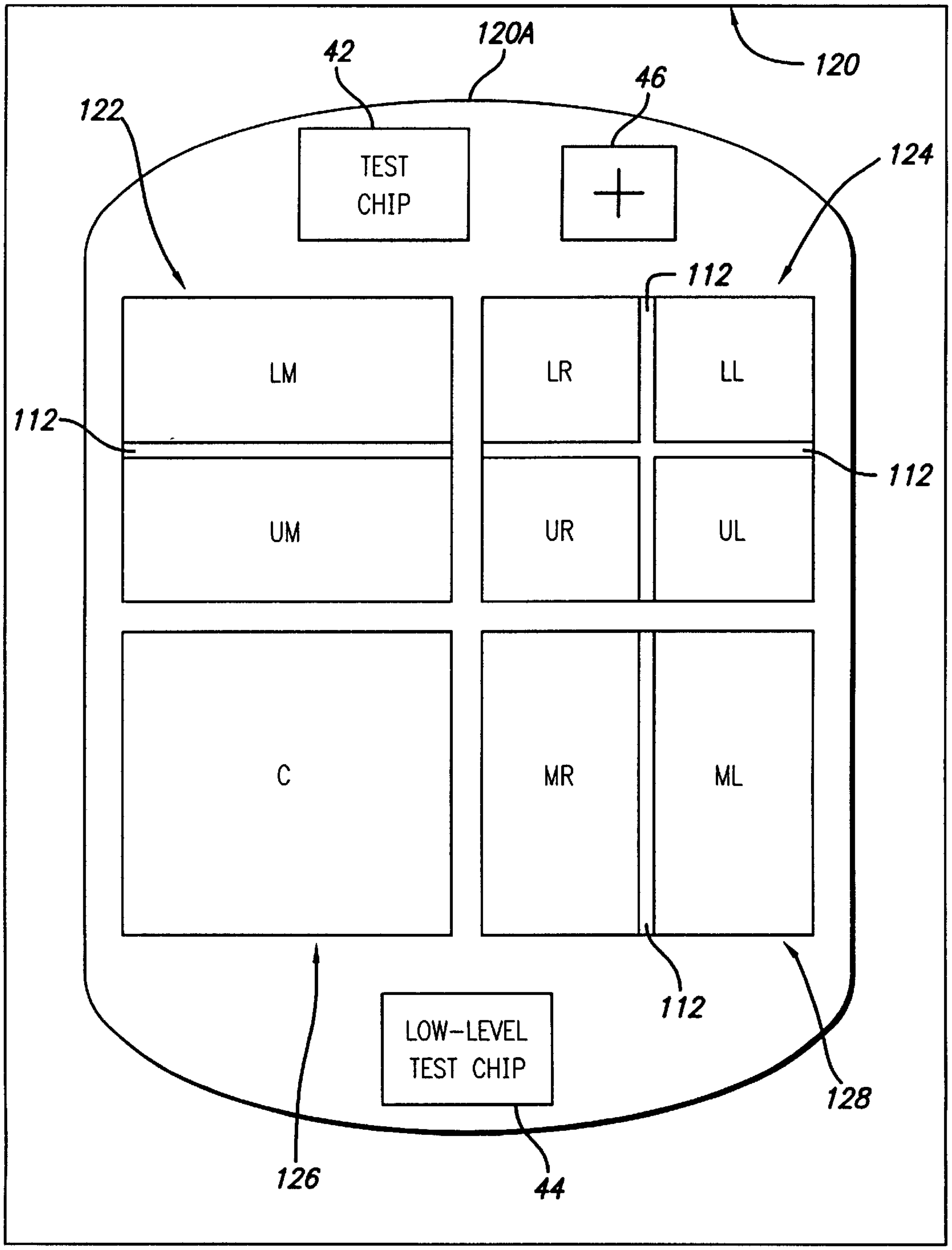
FIGS. 6A and 6B are schematic drawings of a reticle employed in the alternate embodiment of the method of the present invention.
Figure 6B:
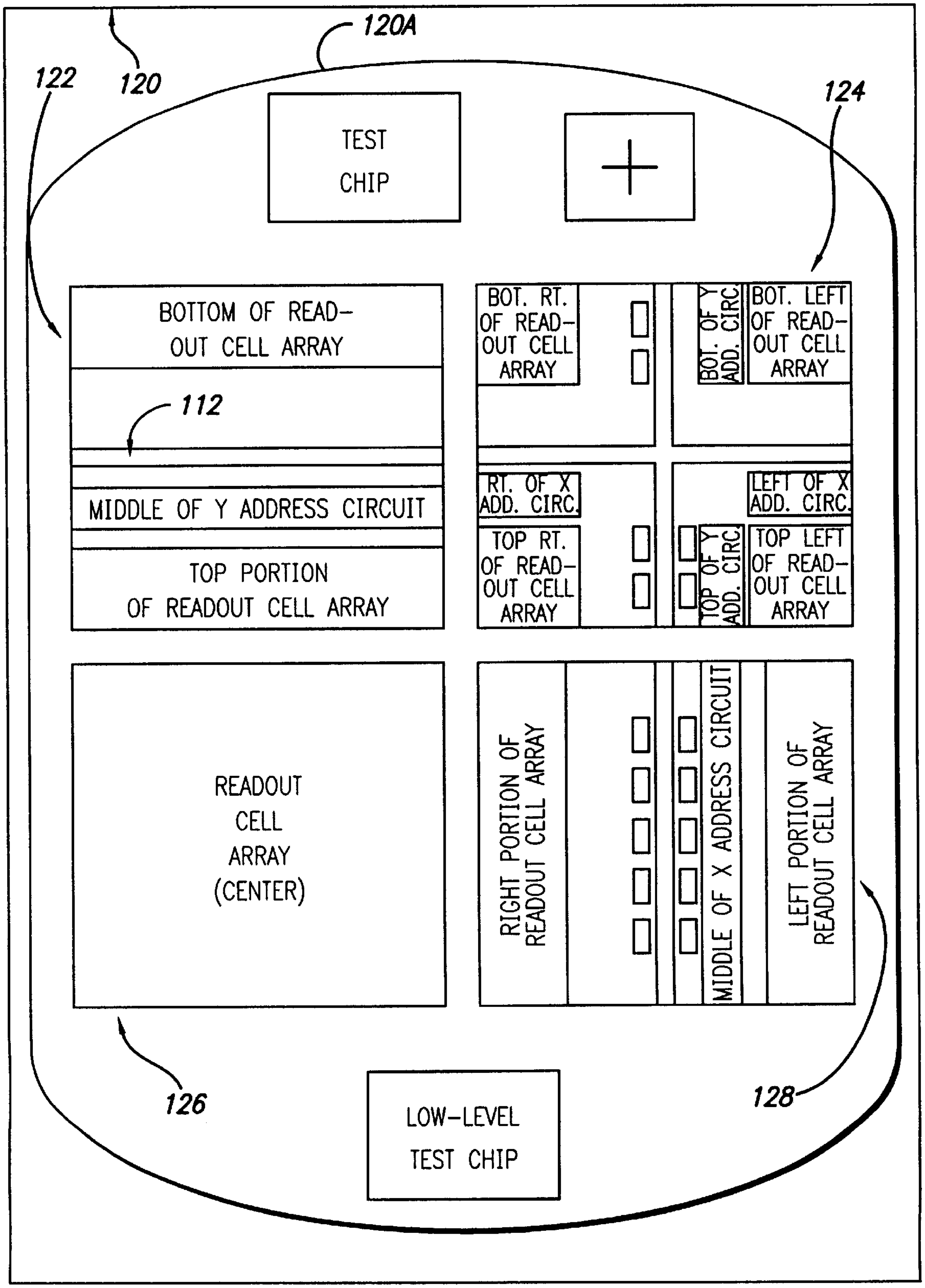

Referring to FIGS. 6A and 6B, a reticle including the four image fields corresponding to the four wafer sections described above is illustrated in a top schematic view. In FIG. 6A, the four image fields of the reticle 120 are illustrated in a manner corresponding to that of FIG. 5 whereas in FIG. 6B the image fields of the reticle 120, which must lay within the total optical aperture 120A of the wafer stepper, are illustrated showing the general outline of the integrated circuit pattern of FIG. 1 therein to more clearly show the correspondence to the circuit pattern described above in relation to FIGS. 1 and 2. Also shown in FIGS. 6A and 6B are the test chip patterns 42, 44 and the global alignment mark 46 which function in the same manner as described above in relation to FIG. 3.

Referring to FIG. 6A, the reticle 120 includes four discrete reticle image fields 122, 124, 126 and 128 corresponding to the four wafer sections described above in relation to FIG. 5. In particular, image field 124 includes a mask pattern corresponding to the corner circuit sections LR, LL, UR and UL separated by two crossed scribe lanes 112 (shown as double lines). Image field 124 thus corresponds to wafer section I described above in relation to FIG. 5. Image field 122 includes a mask pattern corresponding to the circuit sections LM and UM described above and hence corresponds to wafer section II described above in relation to FIG. 5. Image field 128 in turn includes a mask pattern corresponding to the circuit sections MR and ML described above separated by a vertical scribe lane 112 and hence corresponds to wafer section III described above in relation to FIG. 5. The fourth image field 126 corresponds to the central circuit section (C) and hence corresponds to wafer section IV described above in relation to FIG. 5.

Therefore, each of these aforementioned reticle image fields, except for central image field 126, includes a dicing or scribe lane 112 therein which separate the reticle image fields into subfields. These subfields correspond to the nine integrated circuit sections described above in relation to FIG. 2. This provision of dicing lanes within the reticle image fields in FIG. 6A distinguishes the image field patterns from conventional reticle image fields which traditionally do not include the entire dicing lane partitions therein from a designer viewpoint.

Referring to FIG. 6B, the reticle pattern of FIG. 6A is shown with the portions of the integrated circuit pattern described above in relation to FIG. 1 shown therein. FIG. 6B thus more clearly shows how the four discrete reticle image fields may be used to piece together the architecture of the integrated circuit pattern discussed above in relation to FIG. 1.

Since the reticle image pattern of FIGS. 6A and 6B includes only four image fields, it will be appreciated that only three quarters of the product IC (operative) reticle area needs to be blocked off during exposure of a given image field. This may be compared to the previous embodiment, i.e., the reticle pattern of FIG. 3, where only one ninth of the reticle image is exposed at a time. Therefore, the embodiment of FIGS. 6A and 6B provides a correspondingly more efficient means for exposing the surface of the wafer and will be preferred for many applications.

Figure 7:
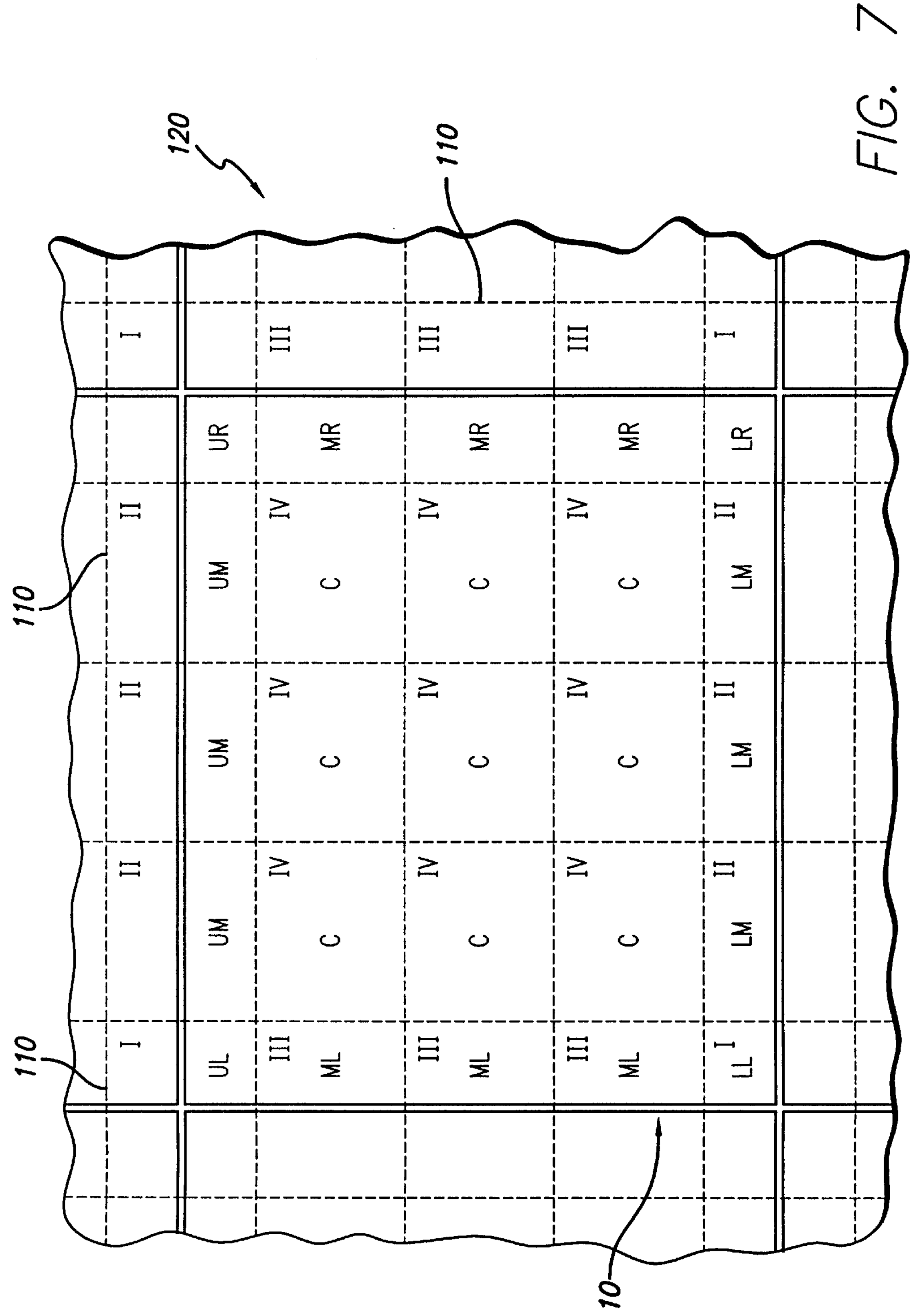
FIG. 7 is a schematic drawing of a portion of a wafer showing an integrated circuit scaled in size in accordance with the alternate embodiment of the present invention.

Referring to FIG. 7, a portion of wafer 100 is illustrated showing how sequential exposure of the image fields of the reticle shown in FIGS. 6A and 6B may be used to reproduce a scalable integrated circuit pattern as in the case of the previously described embodiment.

More specifically, as shown in FIG. 7, the image fields 122, 124, 126 and 128 of FIGS. 6A and 6B have been repeatedly exposed to reproduce the wafer sections 110 on the wafer 100 (with the four differing wafer sections denoted by roman numerals I–IV as in the case of FIG. 5). As shown, the image field 124 corresponding to corner wafer section I has been exposed four times to reproduce the four corners of the integrated circuit 10 (along with the matching corner sections for the adjacent integrated circuits). The image field 122 of the reticle of FIG. 6A has been exposed six times, three times along the top portion of the integrated circuit 10 and three times along the bottom portion of the integrated circuit 10 to reproduce wafer section II a corresponding six times on the wafer 100 as illustrated. This thus provides a horizontal scaling of the circuit pattern by a factor of three in this example as will be appreciated from the drawing.

As may also be seen from FIG. 7, the image field 128 has been exposed a total of six times to reproduce wafer section III, and hence circuit sections ML and MR, each three times and to thereby vertically scale this circuit pattern by a factor of three as shown. Finally, the image field 126 corresponding to the central circuit section C and wafer section IV has been exposed a total of nine times to provide a nine fold increase in this circuit section in the integrated circuit 10 as illustrated. In this way, the four image field reticle pattern described above in relation to FIGS. 6A and 6B also provides the scalability of horizontal, vertical and two dimensional circuit patterns provided by the first embodiment of the present invention.

Figure 8A:
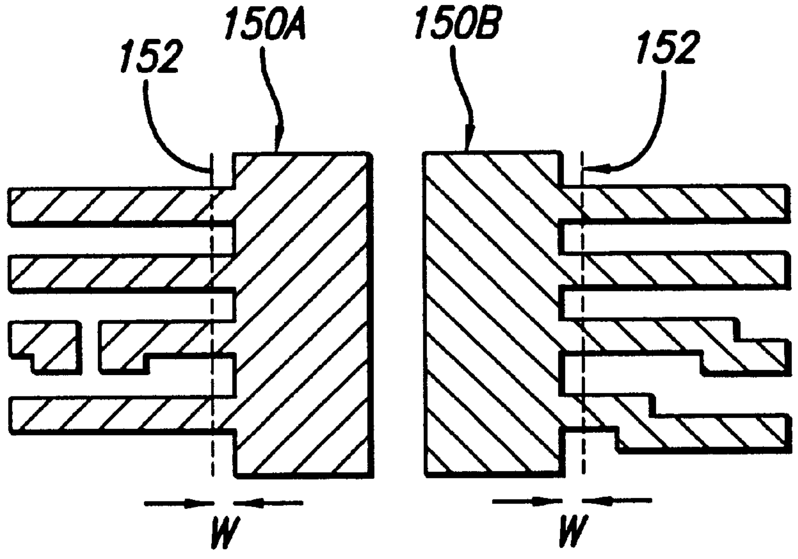
FIGS. 8A–8C are schematic drawings showing the formation of a continuous circuit pattern across image field boundaries in accordance with the method of the present invention.
Figure 8B:
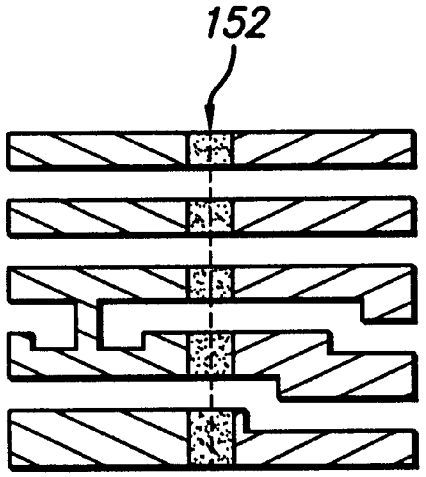
Figure 8C:
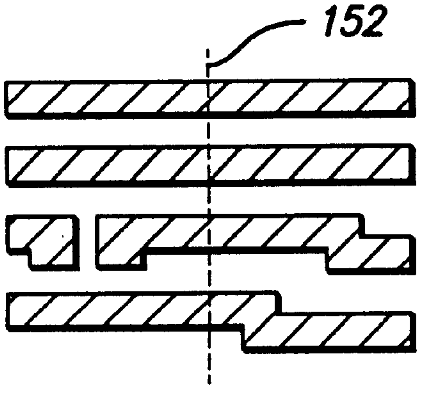

It will of course be appreciated that to provide a suitable overall integrated circuit pattern, no discontinuities in the pattern at the boundaries of the circuit sections or wafer sections corresponding to different exposures of the reticle image fields can be tolerated. Also, the minimal spacing rules of the IC design must be maintained for the IC pattern as a whole. FIGS. 8A, 8B and 8C illustrate the manner in which the integrated circuit pattern may be smoothly continued from image field to image field. For convenience of illustration, FIGS. 8A–8C provide a simple example of patching together portions of a conductor pattern used in an integrated circuit employing CMOS or other semiconductor process technology.

Referring to FIG. 8A, conductor film mask patterns are illustrated for image fields corresponding to adjacent circuit sections. The two mask patterns may be opposite sides of the same image field or may be different image fields depending on the particular circuit section exposed on the integrated circuit (as will be appreciated from the above discussion of the first and second embodiment of the present invention). The dashed line corresponds to the actual edge of the image field as it will appear when exposed on the integrated circuit while the pattern portions 150A and 150B correspond to borders, e.g., of chrome, bounding the respective image fields. The illustrated patterns are "light field" patterns in that a significant portion of the pattern is light transmissive.

To ensure accurate pattern registration between the respective image field patterns, despite some misregistration due to inaccuracy in the wafer stepper positioning system and to allow for effects of double exposure, the IC design rules are relaxed within the area of the dashed lines illustrated in FIG. 8A. In particular, the mask pattern is allowed to extend a distance W, e.g., approximately one half the minimum design spacing rule plus 1.5 times the lithography system's registration precision. This compensates for the two sections being positioned too far apart. In the case where the reticle image boundary lines 152 are overlapped, that is the images have moved too far together, the total length of the two composite exposed patterns must be long enough to meet the minimum design rule dimensions for that layer. Therefore, the overall pattern should be adjusted by a similar amount. Similarly, to correct for possible lateral misalignment of the reticle image parallel to the reticle image boundary, the width of the pattern geometry at the boundary must be wide enough so that across the diagonal overlap of the two reticle exposures a minimum design dimension will be maintained. To ensure that shorting does not occur between adjacent lines, the smallest width conductor pattern at the boundary area should be the minimum width allowed by the design rules plus three registration distances to allow for the width reduction due to double exposure of the photoresist.

Referring to FIG. 8B, the exposed photoresist on the wafer exposed by imaging of the two image field pattern portions shown in FIG. 8A is shown. The boundary between the circuit patterns imaged by separate reticle image field exposures is again illustrated by the dashed line and the area 152 illustrates the area double exposed at the reticle image field overlap boundary. FIG. 8C in turn shows the developed photo resist pattern on the wafer which is now ready for a conventional etching step.

For reticle image fields that are mostly opaque, which are typically employed for patterns for cutting "holes" in films on the wafer, i.e., "dark field" reticles, a similar approach at the reticle image field boundaries may be employed. More specifically, a pattern is extended across the boundary between image fields by approximately 1.5 times the lithography system's registration precision to ensure full exposure in the case where the reticle image boundary lines are separated. To compensate for the case where the reticle image boundary lines are overlapped, that is the images have moved too far together, total lengths of the two composite exposed patterns must be long enough to meet the minimum design ruled dimensions for that layer. Similarly, to correct for possible lateral misalignment of the reticle image is parallel to the reticle image boundary, the width of the pattern geometry at the boundary must be wide enough so that across the diagonal overlap of the two reticle exposures a minimum design dimension will be maintained.

It will be appreciated that the aforementioned modifications of the design rules to allow for the various misregistrations and double exposure problems can be varied to account for the capabilities of the particular lithography system and the design rules of the particular application for which the method is being employed.

Figure 9:
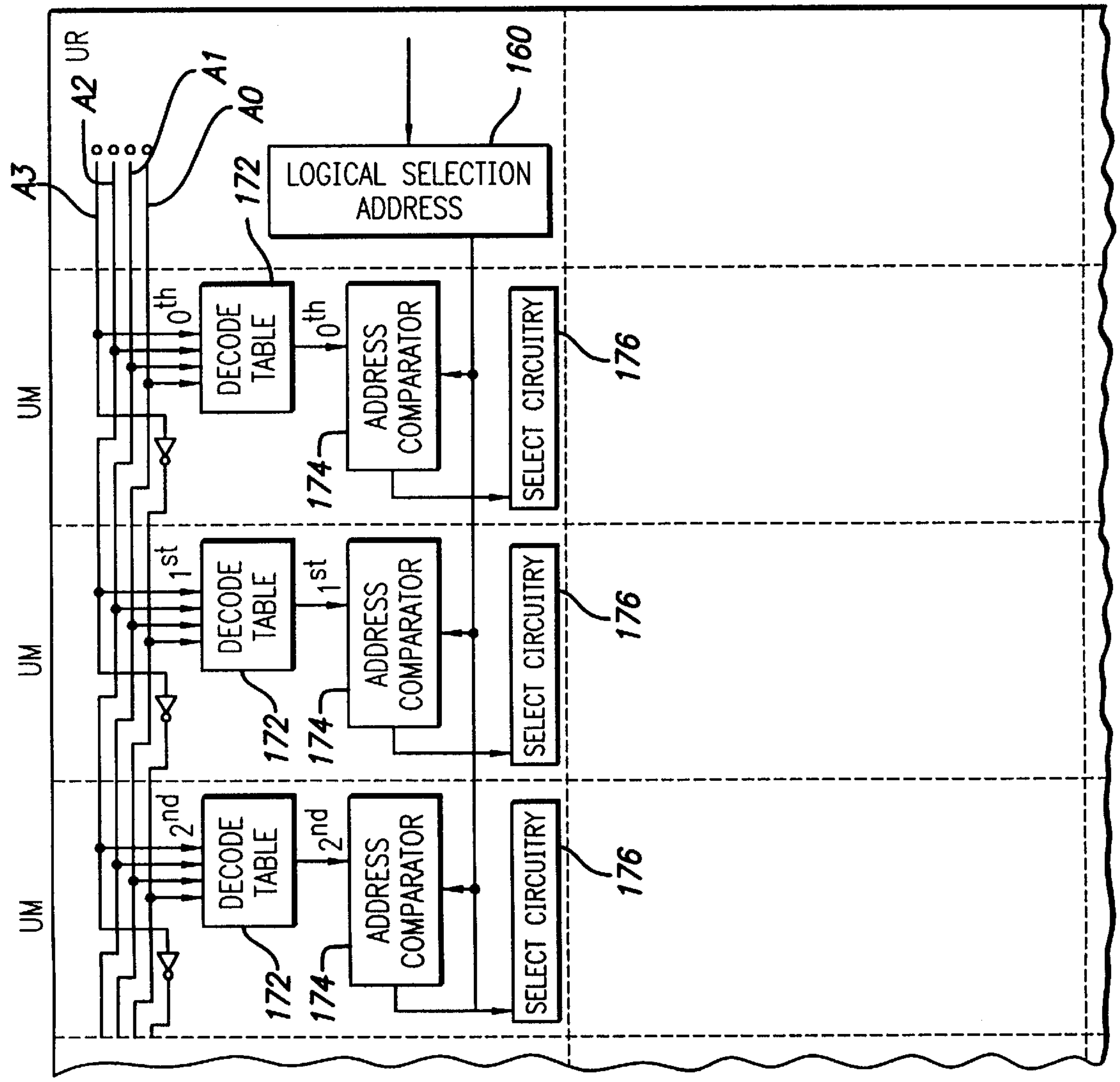
FIG. 9 is a schematic drawing of an addressing scheme for allowing independent addressing of identical circuit sections imaged from identical image fields, in accordance with the method of the present invention.
Figure 10A:
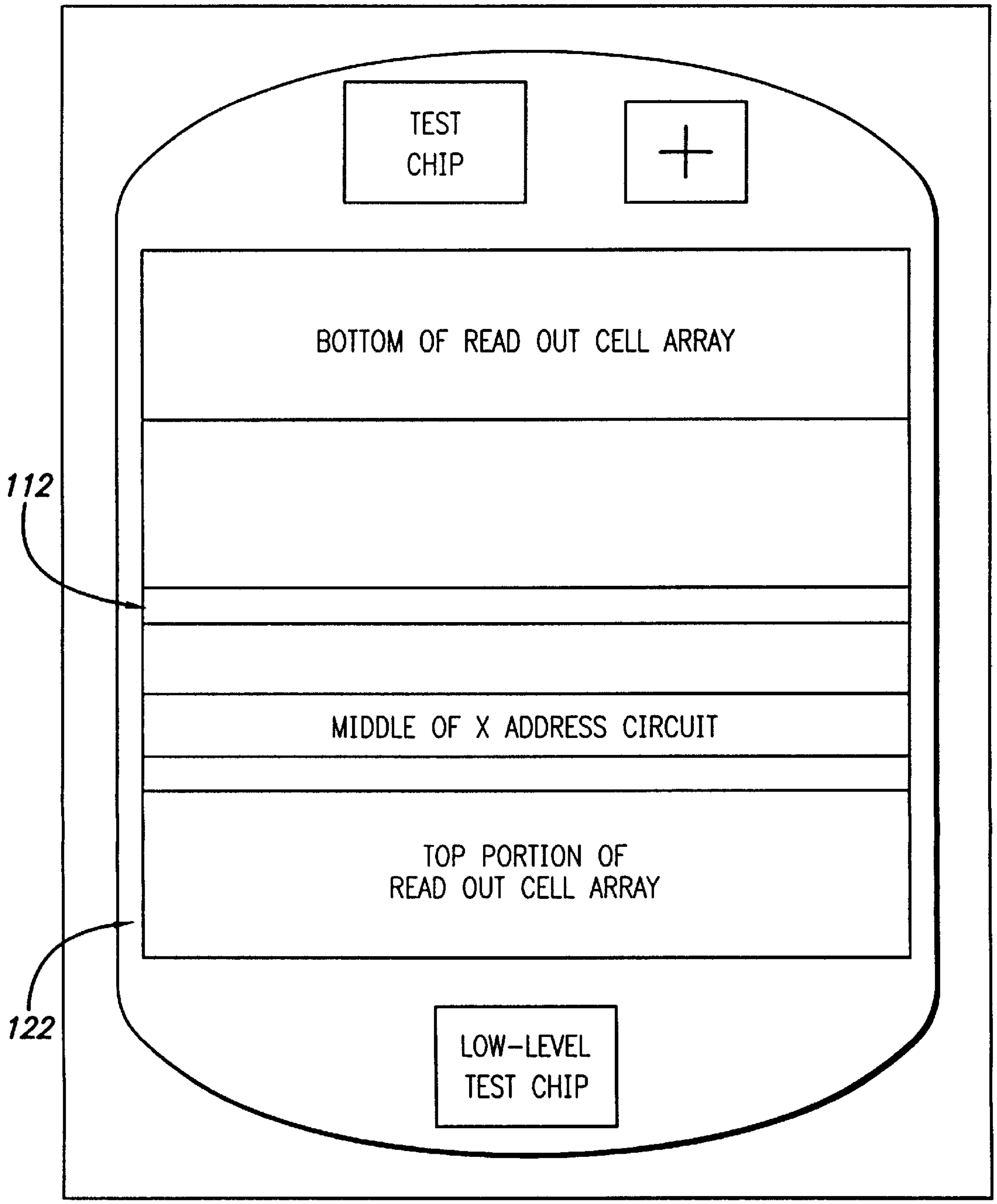
FIGS. 10A–10D are schematic drawings of four separate reticles employed in a third embodiment of the method of the present invention, each reticle having an image pattern corresponding to one of the image fields of the reticle illustrated in FIGS. 6A and 6B.
Figure 10B:
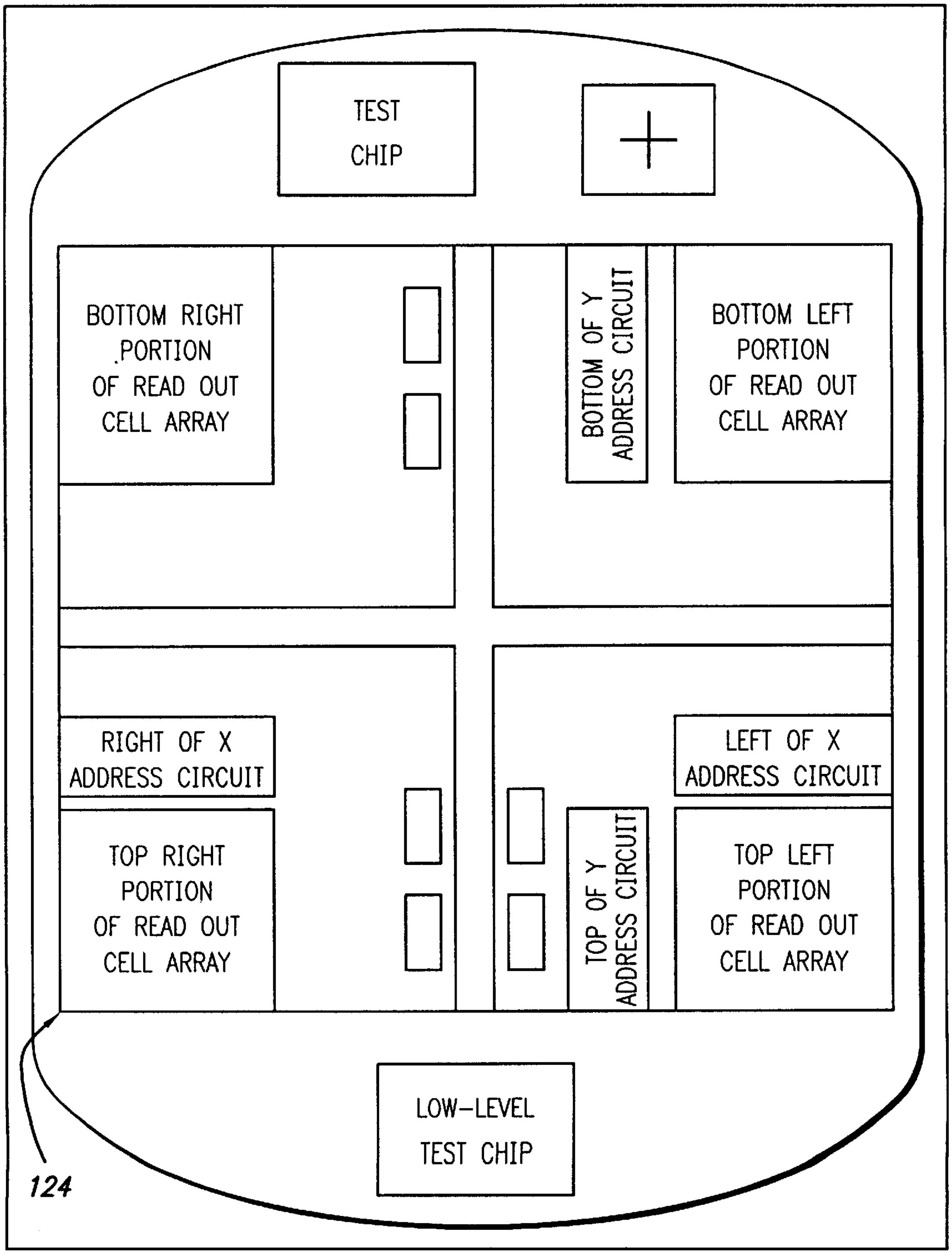
Figure 10C:
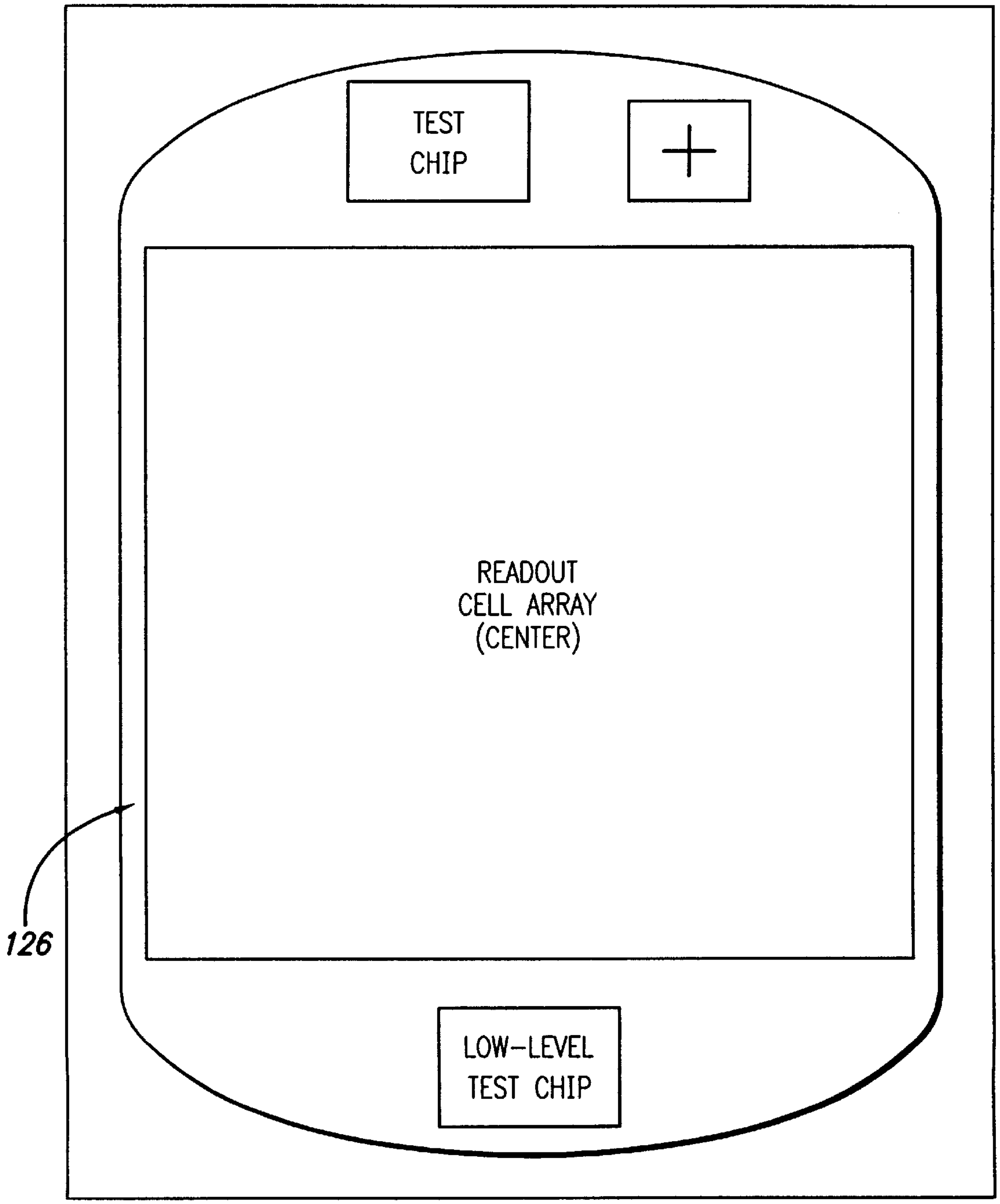
Figure 10D:
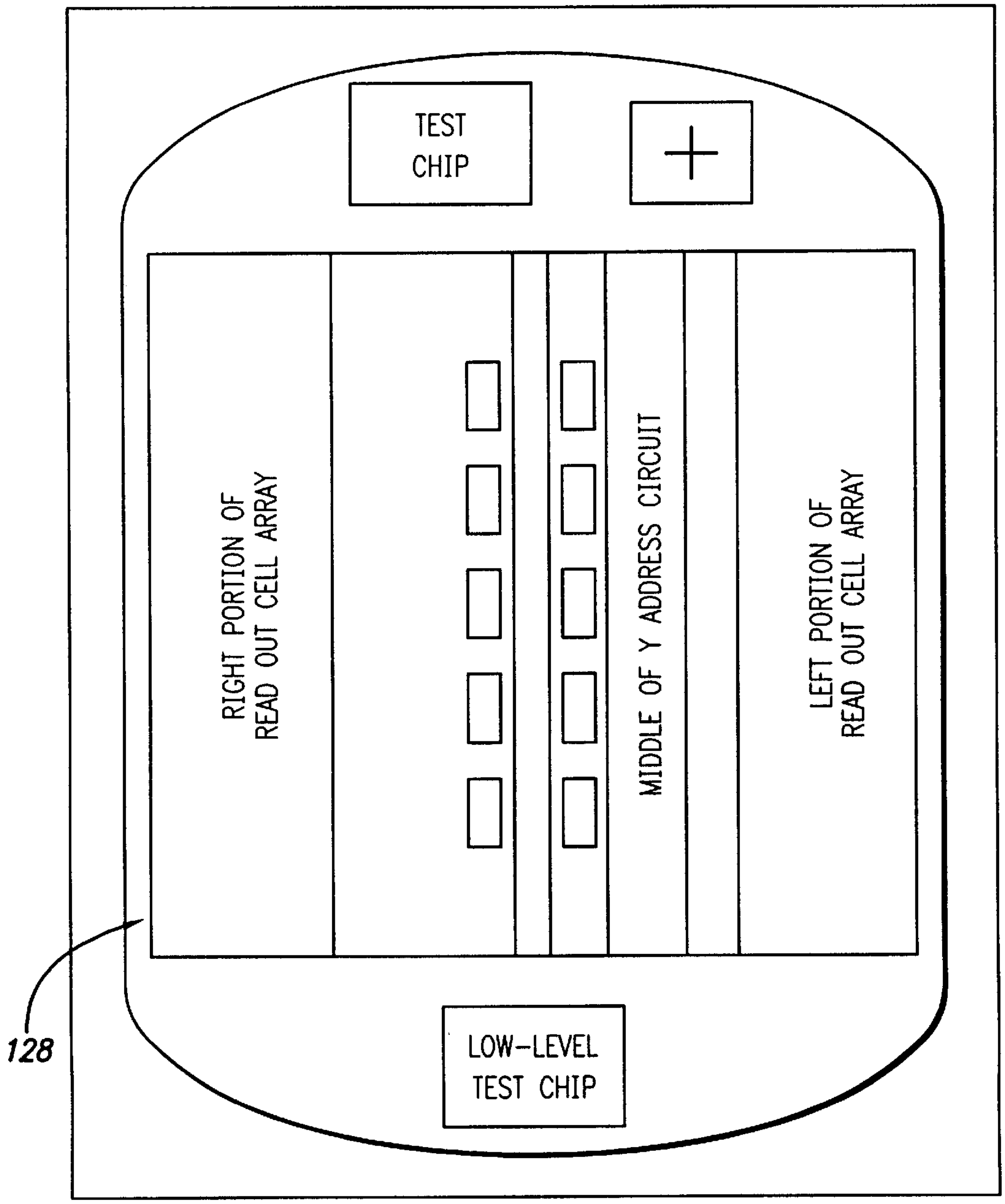

In FIG. 9, an addressing scheme for providing such random access to separate circuit patterns imaged from the same reticle image field is illustrated.

The present invention allows for scalability of integrated circuit patterns for both horizontal, vertical and two dimensional repeatable circuit patterns. Since those circuit patterns which are repeated to scale the integrated circuit dimensions are identical copies of each other, it will be appreciated that addressing may only be employed in a sequential manner, for example, such as in a shift register addressing scheme. To provide faster access, and for certain applications, random access is required. This in turn requires that each copy of the reticle image field exposed on the wafer surface must somehow respond to a unique address relative to its "clones." In FIG. 9, a simple example of a suitable addressing scheme providing for eight unique locations on the integrated circuit for circuit sections exposed from the same reticle image field is illustrated.

More specifically, referring to FIG. 9, portions of X and Y address circuitry are illustrated shown on a portion of an integrated circuit pattern provided in accordance with the present invention.

Since the operation of the address circuit for the X address and Y address selection circuitry are the same only the operation of the Y address selection circuitry will be discussed in relation to FIG. 9 for brevity. The address circuit 160 in the circuit section UR receives an input address signal either directly from the input pads of the IC (not shown) or via input buffering, multiplexer or preliminary addressing circuitry, i.e., a readout controller (not shown). The output of the address circuit 160 in the illustrated embodiment includes four section status lines. These lines carry the static address data which identifies the particular copy of the circuit pattern, imaged by the repeated exposure of the same reticle image field. Additional address circuitry to identify a particular logical component (e.g., select circuitry) within a given circuit section will also be provided but may be conventional in nature and hence is not described in detail for FIG. 9.

The assignment of a unique section number is a static process which in this embodiment involves two circuit functions illustrated in FIG. 9. The first function is a simple "daisy chain" of section physical number bus lines (A0, A1, A2, A3) which have their initial logic zero values assigned from the upper right UR unique corner of the integrated circuit. The second function is a physical section address to logical section address conversion table 172 which has the full map required for the maximum number of sections permitted by the particular design. See Table 1 for an example of the mapping of the section physical addresses created by the distributed "daisy chain" and their corresponding logical section numbers in decimal. The maximum number of sections is 2×N where N is equal to the number of lines in the "daisy chain" bus.

The "daisy chain" function in each section receives the logical states on the section physical bus and passes these to the conversion table. At this point the high order line in the physical bus is shifted down to the lowest order position, in FIG. 9 A3 is shifted to A0. All other lines in the bus are shifted up one, e.g., A2 is shifted to A3, A1 is shifted to A2 and A0 is shifted to A1. Then the new A0 is logically inverted and all lines in the bus are presented to the next section. The effect of this manipulation is to generate a new physical address for a reticle image section, even though the circuitry is exactly the same.

These physical bus values do not follow an ascending binary progression, so in each upper middle UM section in FIG. 9 a lookup table 172 decodes the physical bus section address value to a progressive binary value or logical value. The output of the lookup type conversion table 172 is an input to the section address comparator 174 which is compared to the "random" logical selection address which may be generated on the integrated circuit or taken directly from input pads on the IC. When the section logical value is equivalent to the selection address the comparator 174 sets its output true and the section's selection circuitry 176 reacts to this event as appropriate to its design function.

Table 1 shows how the decoder circuit algorithm functions for an example with four data lines and eight identical sections ("sec. 0–7") along with the corner sections.

TABLE 1

| Section Status Lines | Sec. 0 | Sec. 1 | Sec. 2 | Sec. 3 | Sec. 4 | Sec. 5 | Sec. 6 | Sec. 7 |
|---|---|---|---|---|---|---|---|---|
| A3 | 0 | 0 | 0 | 0 | 1 | 1 | 1 | 1 |
| A2 | 0 | 0 | 0 | 1 | 1 | 1 | 1 | 0 |
| A1 | 0 | 0 | 1 | 1 | 1 | 1 | 0 | 0 |
| A0 | 0 | 1 | 1 | 1 | 1 | 0 | 0 | 0 |
| Physical Decimal Number | 0 | 1 | 3 | 7 | 15 | 14 | 12 | 8 |
| Logical Decimal Number | 0 | 1 | 2 | 3 | 4 | 5 | 6 | 7 |

It will be appreciated that more complex addressing schemes may also be implemented which will provide unique addressing for otherwise identical circuit sections imaged by separate exposures of the same image field. In particular where the number of sections needed to be addressed exceeds 16 such more complex schemes may in some cases be preferred.

Referring to FIGS. 10A–10D, a third embodiment of the present invention is illustrated which employs the same image fields discussed above in relation to FIGS. 6A and 6B but which provides a single image field for each reticle.

More specifically, referring to FIGS. 10A–10D, each figure illustrates a separate reticle pattern which is adapted to image one of the four image fields described above in relation to FIGS. 6A–6B (i.e., image fields corresponding to circuit sections I–IV). Creation of the scalable integrated circuit pattern through consecutive imaging of these image fields may proceed in the same manner as described above in relation to FIGS. 6A–6B and 7 with however a new reticle being required for each image field in place of merely blocking off the appropriate image field in the manner described above in relation to the previous embodiment. Since each image field corresponds to the entire available area of the reticle, it will be appreciated that each exposure will expose a larger area of the wafer surface and hence a fewer number of total exposures will be required to expose the entire wafer surface than in the previously described embodiment. However, the time required to change reticles to expose each of the four consecutive image field patterns may typically more than offset the time advantages associated with the reduced number of exposures required for the entire wafer surface. Also, the tooling requirements for the approach illustrated in FIGS. 10A–10B will generally be four times that for the embodiment described in relation to FIGS. 6A–6B and 7. Therefore, in most applications the cost constraints will not make this method the preferred approach. However, for certain applications where cost of the initial tooling is less important than time costs and/or where the reticle changing time is less significant than the exposure time, i.e., products running in high volume, the approach of FIGS. 10A–10D may be preferred.

Although the present invention has been described in relation to fabrication of an ROIC for an infrared focal plane array, it may also be employed for a variety of other imaging device ROICs including visible imaging devices, X-ray imaging devices and IR imagers other than focal plane arrays. Such imager ROICs may employ CCD technology, CMOS or other well known integrated circuit technologies suitable for very large scale integrated circuit processing. The present invention may also be advantageously employed for a variety of other devices which may include serial access memory devices, dynamic or static random access memories, read only memories (ROMs) such as electrically erasable programmable ROMs (EEPROMs), EPROMs, PROMs and ROMs of various architectures. A common characteristic of these devices which makes them suitable for use with the present invention is an architecture with a repeatable structure through the center axes (of which there could be a plurality) which allows buildup of a larger circuit pattern through repetitive imaging.

Additionally, it will be appreciated that in some circumstances integrated circuit devices having more complex architectures will also be suitable for use with the present invention assuming that circuit patterns repeat at some level. For example, CPUs and other computational devices such as single instruction multiple data (SIMD) devices or multiple instruction multiple data (MIMD) devices may, depending on the architecture, have repeatable logic or other circuit structures which are suitable for the processing method of the present invention. Also, certain random devices that are integrated in large multidevice chips or wafer scale systems could be processed in larger clusters in accordance with the present invention. For example, one example of such devices include field programmable gate array (FPGA) devices.

Therefore, the present invention may generally be suitably employed with any device having a repeatable pattern, where a larger area device is desired.

Referring to Table 2, the manner in which the various above-noted integrated circuit devices may be advantageously created in accordance with the photo composition method of the present invention is illustrated. In particular, Table 2 illustrates the manner in which the integrated circuit device overall pattern may be broken into four quadrants of a reticle image, i.e., the reticle image fields corresponding to wafer sections I–IV described above. The abbreviations in the table correspond to conventional abbreviations including those described above, i.e., ROIC (readout integrated circuit), CCD (charge coupled device), SIMD (single instruction multiple data, MIMD (multiple instruction multiple data), DRAM (dynamic random access memory), SRAM (static random access memory), PROM (programmable read only memory), ROM (read only memory), EEPROM (electrically erasable programmable read only memory), EPROM (erasable programmable read only memory), FPGA (field programmable gate array), MUX (multiplexer).

TABLE 2

| | Reticle Image Quadrant | | | |
|---|---|---|---|---|
| Architecture | I (Corner) | II (Horizontal) | III (Vertical) | IV (Array Core) |
| Staring 2-D ROIC | overhead control, unique pads | X-shift register & MUX, output pads, detcom, windowing control | Y-shift register, detector common, windowing control, supply pads | input circuits |
| Linear ROIC (e.g., TDI) | overhead control, unique pads, Y-shift register, detector common, Y scribe-lanes & partial Y | N/A | N/A | input circuits, TDI MUX, X shift register & MUX, output pads, det com, X scribelanes |
| X-ray ROIC | overhead control, unique pads | X-shift register & MUX, output pads, detcom, fast MUX, serial MUX | Y-shift register, detcom, , supply pads | X-shift register & MUX, output pads, detcom, X scribelanes input circuits |
| CCD Imager | overhead control, output, unique pads | fast MUX, serial MUX | routing for CCD clocks, clock pads | CCD image channels |
| SIMD Computer | overhead control, instruction pads | X-address & MUX, input/output pads | Y-address & MUX, supply pads | processor elements |
| MIMD Computer | overhead control, instruction pads | X-address & MUX input/output pads | Y-address & MUX, supply pads | processor elements |
| DRAM | overhead control, unique pads | bit-address & MUX, bit line sense amps, input/output pads | word line address, supply pads | dynamic memory bits |
| SRAM | overhead control, unique pads | bit-address & MUX, bit line sense amps, input/output pads | word line address, supply pads | static memory bits |
| CCD Memory | overhead control, output, unique pads | fast CCD serial MUX | routing for CCD clocks | CCD memory channels |
| PROM, ROM EEPROM, EPROM | overhead control, unique pads | bit-address & MUX, bit line sense amps, input/output pads | word line address, supply pads | storage bits |
| FPGA | overhead control, instruction pads, program-ming pads | X-address & MUX, input/output pads, supply pads | Y-address & MUX, input/output pads, supply pads | core logic array or programmable logic |

In view of the foregoing, it will be appreciated that the present invention provides significant advantages in processing of very large scale integrated circuit devices including those specifically described above. In particular, the present invention provides the capability for high resolution (submicron) CMOS and other processes in very large scale devices (e.g., those exceeding the 18–22 millimeter current size constraints for conventional single image integrated circuit reticle processing). Furthermore, the present invention provides scalability in an arbitrary manner for such devices while at the same time keeping reticle tooling costs at a reasonable level and without requiring modifications to conventional silicon foundry processing technology and equipment or facility or modifying existing design rules for standard CMOS and other integrated circuit processing techniques.

Further features and advantages will be appreciated by those skilled in the art. Also, it will be appreciated that the foregoing description of the preferred embodiments of the present invention are in no way limiting in nature and are merely examples of the features, advantages and implementation of the present invention.

What is claimed is:

1. A method of photo creation of an integrated circuit pattern on a semiconductor substrate employing a reticle pattern having a plurality of discrete image fields, each image field corresponding to a portion of the integrated circuit pattern to be formed on the substrate, wherein at least one of the discrete image fields includes plural subfields separated by dicing lanes corresponding to a division between corner portions of four adjacent separate integrated circuit chips having the same integrated circuit pattern to be formed on the semiconductor substrate, the method comprising:

exposing a first portion of the semiconductor substrate with one of said discrete image fields to create a first integrated circuit section;

repeating said exposing a plurality of times for additional portions of the substrate including exposing portions of the substrate with each of said plurality of image fields, wherein any subfields of an image field are simultaneously exposed, wherein at least one of said image fields is exposed on said substrate a plurality of times, and wherein the complete integrated circuit pattern along with the dicing lanes defining the boundary of the integrated circuit is exposed on the substrate.

2. A method as set out in claim 1, further comprising the step of optically blocking all of said plurality of image fields other than the image field being exposed during each act of exposing.

3. A method as set out in claim 2, wherein said step of optically blocking comprises covering the image fields not being exposed by one or more blocking vanes.

4. A method as set out in claim 1, wherein the reticle pattern comprises nine discrete image fields.

5. A method as set out in claim 1, wherein the reticle pattern comprise four discrete image fields.

6. A method as set out in claim 1, further comprising, prior to each step of exposing, a positioning step for positioning the reticle image field to be exposed relative to the semiconductor substrate.

7. A method as set out in claim 6, wherein the step of positioning comprises aligning the image field using a global alignment mark on the integrated circuit substrate.

8. A method of exposing a semiconductor wafer substrate with a pattern corresponding to an integrated circuit so as to recreate the integrated circuit pattern a plurality of times on the wafer substrate corresponding to a number of discrete integrated circuit chips to be formed on the wafer substrate, the integrated circuit pattern having a layout comprising a horizontally repeating pattern of circuit features, a vertically repeating pattern of circuit features and a two dimensional repeating pattern of circuit features, the method employing a reticle pattern having a plurality of separate image fields including an image field corresponding to a portion of the two dimensional repeating pattern of circuit features, an image field corresponding to a portion of the horizontally repeating pattern of circuit features, an image field corresponding to a portion of the vertically repeating pattern of circuit features, and a corner image field corresponding to the four corner sections of the integrated circuit layout pattern and including dicing lanes inside the image field, the method comprising:

exposing the wafer substrate with one of said separate image fields of said reticle; and repeating said exposing a plurality of times for each of said image fields, wherein said image field corresponding to a portion of the repeating two dimensional pattern of circuit features is repeatedly exposed on the wafer substrate plural times for each integrated circuit to be formed on the wafer substrate, wherein said image field corresponding to a portion of the horizontally repeating pattern is repeatedly exposed on the wafer substrate plural times for each integrated circuit to be formed on the wafer substrate, wherein said image field corresponding to a portion of the vertically repeating pattern is repeatedly exposed on the wafer substrate plural times for each integrated circuit to be formed on the wafer substrate, and wherein said corner image field is repeatedly exposed on the wafer substrate such that corner portions of plural adjacent integrated circuits on the wafer substrate are simultaneously exposed with a single exposure of the corner image field.

9. A method as set out in claim 8, wherein the integrated circuit pattern corresponds to an infrared focal plane array readout circuit and wherein the two dimensional repeating pattern of circuit features corresponds to the readout cells for the infrared focal plane array detector elements.

10. A method as set out in claim 9, wherein the horizontally repeating pattern corresponds to the X address circuitry of the readout circuit.

11. A method as set out in claim 9, wherein the vertically repeating pattern corresponds to the Y address circuitry of the readout circuit.

12. A method as set out in claim 8, wherein the integrated circuit pattern corresponds to a memory device and wherein the two dimensional repeating pattern of regular circuit features corresponds to the memory elements of the memory device.

13. A method as set out in claim 8, wherein the step of exposing the integrated circuit wafer substrate comprises optically blocking the three of the four reticle image fields not being exposed.

14. A method as set out in claim 8, wherein the dicing lanes separate the corner sections of four discrete integrated circuit chips to be imaged together by exposure of the corner image field.

15. A method of exposing a semiconductor wafer substrate with a pattern corresponding to an integrated circuit so as to recreate the integrated circuit pattern a plurality of times on the wafer substrate corresponding to a number of discrete integrated circuit chips to be formed on the wafer substrate, the integrated circuit pattern having a layout comprising a repeating pattern of circuit features, the method employing a reticle pattern having a plurality of separate image fields including an image field corresponding to a portion of the repeating pattern of circuit features, and a corner image field corresponding to the four corner sections of the integrated circuit layout pattern, the method comprising:

exposing the wafer substrate with one of said separate image fields of said reticle; and repeating said exposing a plurality of times for each of said image fields, wherein said image field corresponding to a portion of the repeating pattern of circuit features is repeatedly exposed on the wafer substrate plural times for each integrated circuit to be formed on the wafer substrate, and wherein said corner image field is repeatedly exposed on the wafer substrate such that corner portions of four adjacent integrated circuits on the wafer substrate are simultaneously exposed with a single exposure of the corner image field.

16. A method for photo creation of an integrated circuit pattern on a semiconductor substrate employing a plurality of reticle patterns formed on respective separate reticles, each reticle pattern corresponding to a portion of the integrated circuit pattern to be formed on the substrate, wherein at least one of the reticle patterns is a corner pattern including four subfields corresponding to corner portions of the four adjacent integated circuit patterns to be formed on the semiconductor substrate separated by dicing lanes corresponding to divisions between separate integrated circuit chips having the same integrated circuit pattern to be formed on the semiconductor substrate, the method comprising:

exposing a first portion of the semiconductor substrate with one of said reticle patterns to create a first integrated circuit section;

repeating said exposing a plurality of times for additional portions of the substrate including exposing a portion of the substrate with each of said plurality of reticle patterns, wherein at least one of said reticle patterns is exposed on said substrate a plurality of times, wherein each exposing step for a new reticle pattern includes a step of changing reitcles, wherein said exposing steps create a two dimensional contiguous array of repeatedly exposed integrated sections, and wherein the complete integrated circuit pattern along with the dicing lanes defining the boundary of the integrated circuit is exposed.

17. A method as set out in claim 16, wherein the dicing lanes correspond to divisions between the separate integrated circuit chips.

* * * * *